United States Patent
Stephan et al.

(10) Patent No.: US 10,425,172 B2
(45) Date of Patent: *Sep. 24, 2019

(54) CLUTTER REJECTING BUILT IN TEST FOR ASSIGNMENT-BASED AESA SYSTEMS

(71) Applicant: Raytheon Company, Waltham, MA (US)

(72) Inventors: Larisa Angelique Natalya Stephan, Los Angeles, CA (US); David W. Tang, Rancho Palos Verdes, CA (US); David O. Lahti, Manhattan Beach, CA (US)

(73) Assignee: Raytheon Company, Waltham, MA (US)

( * ) Notice: Subject to any disclaimer, the term of this patent is extended or adjusted under 35 U.S.C. 154(b) by 46 days.

This patent is subject to a terminal disclaimer.

(21) Appl. No.: 15/852,409

(22) Filed: Dec. 22, 2017

(65) Prior Publication Data

US 2019/0199455 A1 Jun. 27, 2019

(51) Int. Cl.
*H04B 17/17* (2015.01)
*H01Q 3/26* (2006.01)
(Continued)

(52) U.S. Cl.
CPC .............. *H04B 17/17* (2015.01); *H01Q 1/246* (2013.01); *H01Q 3/267* (2013.01); *H01Q 3/385* (2013.01);
(Continued)

(58) Field of Classification Search
CPC ........ G01S 7/40; G01S 7/4004; G01S 7/4056; G01S 13/90; G01S 15/89; H01Q 1/246; H01Q 3/00; H01Q 3/22; H01Q 3/24; H01Q 3/26; H01Q 3/28; H01Q 3/36; H01Q 3/267; H01Q 3/385; H01Q 21/20; H04B 1/04; H04B 1/10; H04B 7/00; H04B 7/06; H04B 7/26; H04B 17/00; H04B 17/16; H04B 17/17; H04B 17/19; H04W 16/28; H04W 24/04; H04W 48/16; H04W 56/00; H04W 72/10; H04W 72/0453
USPC ........ 342/173, 174, 195, 372; 375/219, 224, 375/295, 316; 455/59, 418, 435.1, 512, 455/507, 562.1; 714/733
See application file for complete search history.

(56) References Cited

U.S. PATENT DOCUMENTS 3,378,846 A 4/1968 Lowenschuss
5,253,188 A 10/1993 Lee et al.
(Continued)

OTHER PUBLICATIONS

U.S. Notice of Allowance dated Aug. 30, 2018 for U.S. Appl. No. 15/852,417; 15 Pages.
(Continued)

*Primary Examiner* — Shawkat M Ali
(74) *Attorney, Agent, or Firm* — Daly, Crowley Mofford & Durkee, LLP

(57) ABSTRACT

Methods and apparatus to provide clutter rejecting built-in-test and/or fault isolation of individual array elements in assignment-based AESAs. BIT beam states for array element testing can be stored in AESA memory for rapid assignment sequencing of RF waveform generators and receive processing. Simultaneously transmitted signals for BIT sequences have unique signal characteristics that allow test signal clutter rejection on the receive side processing.

17 Claims, 8 Drawing Sheets

(51) Int. Cl.
*H04B 17/19* (2015.01)
*H04W 72/04* (2009.01)
*H01Q 1/24* (2006.01)
*H01Q 3/38* (2006.01)

(52) U.S. Cl.
CPC ........ *H04B 17/19* (2015.01); *H04W 72/0453* (2013.01); *H04W 72/046* (2013.01)

(56) References Cited

U.S. PATENT DOCUMENTS

| | | |
|---|---|---|
| 5,799,022 A | 8/1998 | Williams |
| 5,867,123 A | 2/1999 | Geyh et al. |
| 6,288,673 B1 | 9/2001 | Dolmeta et al. |
| 6,336,065 B1 | 1/2002 | Gibson et al. |
| 6,501,849 B1 | 12/2002 | Gupta et al. |
| 7,005,873 B2 | 2/2006 | Kim et al. |
| 7,203,879 B2 | 4/2007 | Shabib et al. |
| 7,647,530 B2 | 1/2010 | Britt et al. |
| 7,877,636 B2 | 1/2011 | Kim et al. |
| 7,983,809 B2 | 7/2011 | Kell et al. |
| 8,352,486 B1 | 1/2013 | McGrory et al. |
| 8,451,165 B2 | 5/2013 | Puzella et al. |
| 8,547,275 B2 | 10/2013 | Culkin et al. |
| 8,633,861 B2 | 1/2014 | De Luca et al. |
| 8,988,280 B2 | 3/2015 | Mosca et al. |
| 9,026,161 B2 | 5/2015 | Noble et al. |
| 9,154,172 B1 | 10/2015 | Cruz-Albrecht et al. |
| 9,225,073 B2 | 12/2015 | Culkin et al. |
| 9,276,315 B2 | 3/2016 | Noble et al. |
| 9,479,232 B1 | 10/2016 | Loui et al. |
| 9,705,611 B1 * | 7/2017 | West ...................... H04B 17/12 |
| 9,876,514 B1 | 1/2018 | Corman et al. |
| 10,148,367 B1 * | 12/2018 | Stephan ................ H01Q 3/267 |
| 2005/0046607 A1 | 3/2005 | Volman |
| 2005/0283694 A1 | 12/2005 | Shabib et al. |
| 2009/0153394 A1 | 6/2009 | Navarro et al. |
| 2011/0006949 A1 | 1/2011 | Webb |
| 2012/0119960 A1 | 5/2012 | De Luca et al. |
| 2012/0133549 A1 | 5/2012 | Culkin et al. |
| 2012/0139786 A1 | 6/2012 | Puzella et al. |
| 2012/0169540 A1 | 7/2012 | Jones |
| 2012/0188116 A1 * | 7/2012 | Mosca ................... H01Q 3/267 342/174 |
| 2013/0059618 A1 | 3/2013 | Cao et al. |
| 2013/0181857 A1 | 7/2013 | Noble et al. |
| 2013/0281145 A1 | 10/2013 | Noble et al. |
| 2013/0335269 A1 | 12/2013 | Culkin et al. |
| 2014/0111373 A1 | 4/2014 | Puzella et al. |
| 2015/0198656 A1 | 7/2015 | Holland et al. |
| 2015/0244562 A1 | 8/2015 | Hanson et al. |
| 2017/0310004 A1 | 10/2017 | Swirhun et al. |
| 2018/0083813 A1 | 3/2018 | Novak et al. |
| 2018/0183504 A1 | 6/2018 | McMorrow et al. |

OTHER PUBLICATIONS

U.S. Appl. No. 15/852,417, filed Dec. 22, 2017, Stephan et al.
Jeong et al., "A Self-Compensating Built-In Self-Test Solution for RF Phased Array Mismatch;" Proceedings of the IEEE International Test Conference (ITC); Oct. 6, 2015; 9 Pages.
PCT International Search Report and Written Opinion dated Jan. 23, 2019 for International Application No. PCT/US2018/055137; 16 Pages.
PCT International Search Report and Written Opinion dated Jan. 30, 2019 for International Application No. PCT/US2018/056412; 15 Pages.

* cited by examiner

CLUTTER REJECTING BUILT IN TEST FOR ASSIGNMENT-BASED AESA SYSTEMS

BACKGROUND

Many radio frequency applications exist in which it is necessary to share antenna resources among multiple different transmission and/or reception tasks. For example, in a cellular base station, it may be desirable or necessary to share antenna resources among a number of concurrent user connections being made through the base station. In many of these applications, scheduling-based approaches are typically used to provide antenna sharing.

BRIEF DESCRIPTION OF THE DRAWINGS

The foregoing features of this disclosure may be more fully understood from the following description of the drawings in which.

SUMMARY

Figure 1:
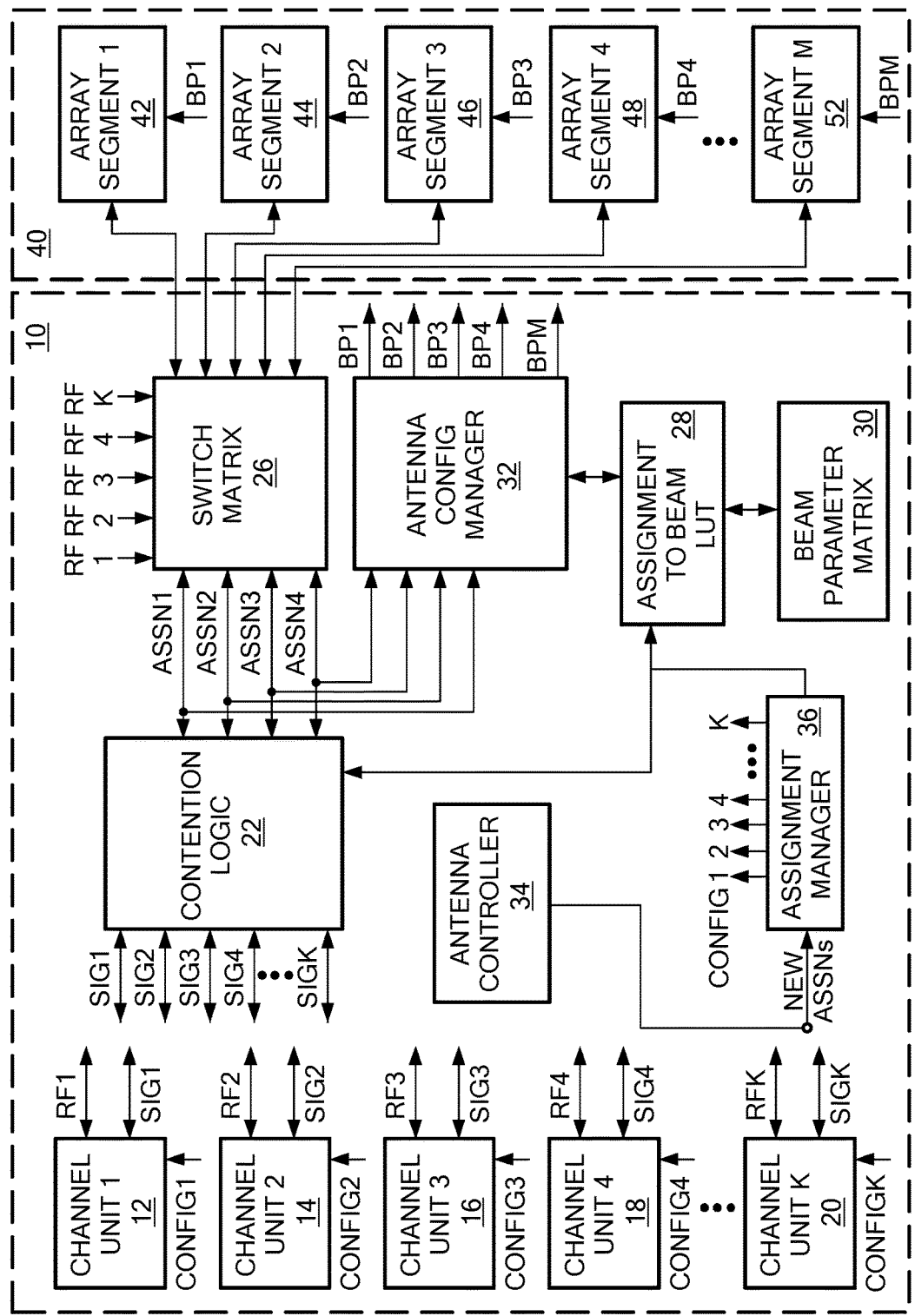
FIG. 1 is an assignment based AESA system having built-in-test (BIT)

Embodiments provide methods and apparatus for clutter-rejecting built-in-test (BIT) and fault isolation of individual array elements in an assignment-based AESA, which uses stored, pre-computed beamstates in the arrays for T/R element phase and attenuation control. This configuration allows high-rate switching of RF transmission in response to electronic assignment commands. In embodiments, transmit channel units generate the assignment commands to the arrays.

In one aspect of the invention, a method comprises: performing built-in-test (BIT) of array elements in first and second arrays in an assignment-based active electronically scanned array (AESA) by: receiving assignments for at least one BIT sequence from pre-determined BIT assignments each of which is mapped to a beamstate, wherein the assignments correspond to generating multiple simultaneous transmit signals having differing characteristics to provide clutter rejection by the second array; configuring one or more elements of the first array for transmitting pulses corresponding to the at least one BIT sequence; configuring one or more elements of the second array for receiving the pulses corresponding to the at least one BIT sequence; transmitting the pulses by the first array corresponding to the at least one BIT sequence; receiving the transmitted pulses at the second array for the at least one BIT sequence; and processing the received pulses for the at least one BIT sequence to detect failures associated with one or more of the elements in the first array and/or the elements in the second array.

A method can further include one or more of the following features: for third and fourth arrays collocated with the first and second arrays, providing clutter rejection for the fourth array when receiving the transmitted pulses from the first array, transmitting pulses by the first array corresponding to the at least one BIT sequence includes transmitting pulses each having different characteristics to provide the clutter rejection, the different characteristics include different center frequencies, the different characteristics include different pulse repetition intervals, the different characteristics include different modulation types, for third and fourth arrays collocated with the first and second arrays, providing clutter rejection by transmitting the pulses by the first array and the third array with different characteristics, iterating pulse transmissions over the one or more elements of the first and second arrays to detect failed elements in the one or more elements of the first and second arrays, and/or iterating pulse transmissions over one or more elements of the third and fourth arrays to detect failed elements in the one or more elements of the third and fourth arrays such that receiving ones of the one or more elements can differentiate each of the pulses transmitted by the first, second, third, and fourth arrays.

In another aspect, a system comprises: an antenna controller configured to perform built-in-test (BIT) of array elements in first and second arrays in an assignment-based active electronically scanned array (AESA), the antenna controller configured to: perform built-in-test (BIT) of array elements in first and second arrays in an assignment-based active electronically scanned array (AESA) by: receiving assignments for at least one BIT sequence from pre-determined BIT assignments each of which is mapped to a beamstate, wherein the assignments correspond to generating multiple simultaneous transmit signals having differing characteristics to provide clutter rejection by the second array; configuring one or more elements of the first array for transmitting pulses corresponding to the at least one BIT sequence; configuring one or more elements of the second array for receiving the pulses corresponding to the at least one BIT sequence; transmitting the pulses by the first array corresponding to the at least one BIT sequence; receiving the transmitted pulses at the second array for the at least one BIT sequence; and processing the received pulses for the at least one BIT sequence to detect failures associated with one or more of the elements in the first array and/or the elements in the second array.

A system can include one or more of the following features: the antenna controller is further configured to: for third and fourth arrays collocated with the first and second arrays, provide clutter rejection for the fourth array when receiving the transmitted pulses from the first array, transmitting pulses by the first array corresponding to the at least one BIT sequence includes transmitting pulses each having different characteristics to provide the clutter rejection, the different characteristics include different center frequencies, the different characteristics include different pulse repetition intervals, the different characteristics include different modulation types, the antenna controller is further configured to: for third and fourth arrays collocated with the first and second arrays, provide clutter rejection by transmitting the pulses by the first array and the third array with different characteristics, the antenna controller is further configured to: iterate pulse transmissions over the one or more elements of the first and second arrays to detect failed elements in the one or more elements of the first and second arrays, and/or the antenna controller is further configured to iterate pulse transmissions over one or more elements of the third and fourth arrays to detect failed elements in the one or more elements of the third and fourth arrays such that receiving ones of the one or more elements can differentiate each of the pulses transmitted by the first, second, third, and fourth arrays.

In a further aspect, a system comprises: first and second arrays that are collocated, each of the first and second arrays comprising a respective waveform generator and a receive module; an antenna controller coupled to the first and second arrays, the respective waveform generators and the receiver modules, the antenna controller configured to perform built-in-test (BIT) of array elements in the first and second arrays in an assignment-based active electronically scanned array (AESA), the antenna controller configured to: generate and send waveform generator parameters to the respective waveform generators which generates RF pulse information and assignments commands for transmission, generate assignments for at least one BIT sequence from pre-determined BIT assignments each of which is mapped to a beamstate, wherein the assignments are sent to a first array which will be transmitting RF signals; configure one or more elements of the first array for transmitting pulses corresponding to the at least one BIT sequence such that each of the pulses has different characteristics to provide clutter rejection; configure one or more elements of the second array for receiving the pulses corresponding to the at least one BIT sequence; generate information to control transmission of the pulses by the first array corresponding to the at least one BIT sequence; generate information to control receiving of the transmitted pulses at the second array for the at least one BIT sequence; and process the received pulses for the at least one BIT sequence to detect failures associated with one or more of the elements in the first array and/or the elements in the second array.

DETAILED DESCRIPTION

In embodiments, a system having an assignment-based active electronically scanned array (AESA) includes built-in test (BIT) in accordance example embodiments of the invention. The system allows a number of transmit/receive assignments to share antenna resources. As used herein, the phrase "transmit/receive assignment" refers to a sequence of transmit and/or receive events having specific antenna beam requirements. The transmit and/or receive events may be separated from one another by one or more "wait" periods, during which no transmit or receive activity is taking place. Some transmit/receive assignments may only involve transmit periods and wait periods, with no receive periods. In a jamming application, for example, a transmit/receive assignment may involve the transmission of one or more predetermined waveforms toward a jamming target at indeterminate times, with wait periods in between. Some other transmit/receive assignments may only involve receive periods and wait periods, with no transmit periods. In a communications application, for example, a transmit/receive assignment may involve listening for signals from a remote user at various times, with wait intervals in between.

In embodiments, a transmit/receive assignment may be in any one of three states at a particular point in time: transmit, receive, and wait. When in a transmit or receive state, a transmit/receive assignment uses an antenna to perform its function. When in a wait state, on the other hand, a transmit/receive assignment will not need to use an antenna. When a transmit/receive assignment enters a wait state, an antenna resource that the assignment was using may be made available for use by other assignments. By intelligently switching an antenna between transmit/receive assignments, the various wait periods associated with the transmit/receive assignments can be filled in leading to an enhanced level of antenna usage. Fast switching antenna architectures enable rapidly changing beam direction/shape to quickly transition between transmit/receive assignments.

FIG. 1 is a block diagram illustrating an example system 10 for allowing a number of transmit/receive assignments to share antenna resources and provide built-in test in accordance with an implementation. System 10 may be used in any number of different applications where transmit and receive tasks can be arranged as transmit/receive assignments and those transmit/receive assignments are to share antenna resources. System 10 may be used with both deterministic and non-deterministic transmit/receive assignments. It is understood that a deterministic system has no randomness in future states of the system so that the same output is produced from a given starting condition or initial state. As illustrated, system 10 may be coupled to an antenna 40.

In general, system 10 allows transmit/receive assignments to contend for antenna resources. Each transmit/receive assignment may have an associated priority value that dictates how much preference is to be given to that assignment over other assignments during antenna resource allocation operations. These priority values, as well as one or more other factors, may be considered to determine which assignments are to be given access to antenna resources. Once a decision has been made to allocate an antenna resource to a particular transmit/receive assignment, the antenna resource may be rapidly configured to achieve an appropriate beam for the transmit/receive assignment. An RF path may also be quickly established between the allocated antenna resource and transmit/receive circuitry associated with the transmit/receive assignment.

System 10 may include: a number of channel units 12, 14, 16, 18, 20; contention logic 22; a switch matrix 26; an assignment-to-beam lookup table (LUT) 28; a beam parameter matrix 30; an antenna configuration manager 32, and an assignment manager 36 coordinating the control of the transmit/receive assignments for both applications and built-in-test and an antenna controller 34 that provides assignments both for normal operation and for built-in test. In an example embodiment, the BIT module 34 can form a portion of the assignment manager 36. Antenna 40 coupled to system 10 may include, for example, a phased array antenna. In some implementations, an active electronically scanned array (AESA) or similar active array having transmit/receive circuitry located at each antenna element may be used. Antenna 40 may be divided into multiple array segments 42, 44, 46, 48, 52. Although illustrated with five array segments 42, 44, 46, 48, 52 in FIG. 1, it should be appreciated that any number of different array segments may be used in various implementations.

Channel units 12, 14, 16, 18, 20 are each operative for implementing a corresponding transmit/receive assignment. If a transmit/receive assignment requires a particular RF waveform to be generated, for example, then the associated channel unit may include functionality for generating the RF waveform. If a transmit/receive assignment requires that a particular type of RF signal be received, then the associated channel unit may include functionality for processing the received signal. Any number of channel units 12, 14, 16, 18, 20 may be used in a particular implementation.

Contention logic 22 is operative for allocating antenna resources to transmit/receive assignments (and corresponding channel units) based, at least in part, on assignment priority. Data can be in memory on groups of beams associated with current transmit/receive assignments that are compatible with one another, e.g., groups of beams that can be simultaneously generated by antenna 40 without creating problems in corresponding transmit and receive circuitry (e.g., interference, crosstalk, overloading a receiver front end, etc.).

Switch matrix 26 is operative for rapidly providing a radio frequency (RF) path between a channel unit 12, 14, 16, 18, 20 and a corresponding array segment 42, 44, 46, 48, 52 after a transmit/receive assignment has successfully contended for antenna resources. For example, if contention logic 22 allocates second antenna segment 44 to a transmit/receive assignment of first channel unit 12, switch matrix 26 may provide an RF path between first channel unit 12 and second antenna segment 44 by making specific internal connections. Although a switch matrix 26 is shown in the illustrative embodiment, it should be appreciated that other switching devices, structures, or techniques may be used in other implementations.

Assignment-to-beam LUT 28 comprises stored data that may include information identifying a particular antenna beam for each transmit/receive assignment being handled by system 10. Beam parameter matrix 30 comprises stored data that may include beam parameter data for each different beam that antenna 40 or individual array segments 42, 44, 46, 48, 52 may be called upon to create. In general, the beam parameter data may include settings for hardware components within antenna 40 or array segments 42, 44, 46, 48, 52. The beam parameter data may include, for example, phase shift information for phase shifters associated with each active element of an array segment. The beam parameter data may also include, for example, attenuation information for attenuators associated with each active element of an array segment. Other types of information may also be included. For example, in some implementations, beam parameter data may include data for controlling switches, power amplifiers, and/or other circuitry. As will be appreciated, the configurable components within antenna 40 may vary from implementation to implementation. In some implementations, beam parameter matrix 30 may include data for a complete set of antenna states.

Antenna configuration manager 32 controls the configuration of antenna resources in accordance with associated transmit/receive assignments. In a typical scenario, contention logic 22 may indicate to antenna configuration manager 32 a transmit/receive assignment that successfully contended for access to an antenna resource. Antenna configuration manager 32 may then consult assignment-to-beam LUT 28 to identify a beam corresponding to the indicated transmit/receive assignment. The beam identity may then be delivered to beam parameter matrix 30 to retrieve beam parameter data for configuring the corresponding antenna resource. Antenna configuration manager 32 may then deliver the beam parameter data to the antenna resource (e.g., to fourth array segment 48) to configure the resource for use with the transmit/receive assignment. In an alternative implementation, assignment-to-beam LUT 28 may store beam parameter data for configuring the antenna 40 for each transmit/receive assignment, rather than beam identities. This approach may dispense with the need for beam parameter matrix 30.

As described previously, each transmit/receive assignment that is being handled by system 10 may have a specific antenna beam associated with it. This antenna beam will typically be directed from system 10 toward a remote target or communication device related to the transmit/receive assignment. Over time, the locations and/or orientations of the system 10 and a remote target or communication device may change. As such, information about the beam associated with a particular transmit/receive assignment must be updated.

Assignment manager 36 allocates transmit/receive assignments to channel units 12, 14, 16, 18, 20. Assignment manager 36 may be implemented using, for example, a digital processor or similar device. In some implementations, assignment manager 36 may regularly receive lists of new transmit/receive assignments to be handled by system 10. Assignment manager 36 may allocate some or all of these new assignments to corresponding channel units 12, 14, 16, 18, 20. In some cases, assignment manager 36 may decide to reject one or more new assignments. For example, lower priority assignments that may create long switching times back to higher priority assignments may be rejected in some implementations. Other criteria for rejecting assignments may also or alternatively be used. Assignment manager 36 may also be configured to replace one or more assignments currently allocated to a channel unit with a new assignment.

After a transmit/receive assignment has been allocated to a channel unit, the channel unit may need to be configured or programmed to perform the assignment. In some implementations, reconfigurable hardware (e.g., field programmable gate arrays (FPGAs), reconfigurable data path arrays (rDPAs), etc.) may be used to implement all or a portion of channel units 12, 14, 16, 18, 20. As is well known, reconfigurable hardware generally requires configuration parameters to be delivered to the hardware to configure the hardware to perform a particular task. In at least one implementation, a database of assignment configuration parameters (not shown in FIG. 1) may be provided within system 10 for use in configuring channel units 12, 14, 16, 18, 20 for use with corresponding transmit/receive assignments. By using pre-calculated configuration information in this manner, channel units 12, 14, 16, 18, 20 can be configured in a rapid fashion.

In some implementations, assignment manager 36 may carry out the configuration of channel units 12, 14, 16, 18, 20. In other implementations, channel units 12, 14, 16, 18, 20 may include functionality for self-configuration. That is, assignment manager 36 may only need to send an indication of an allocated transmit/receive assignment to a channel unit and the channel unit may then retrieve a corresponding configuration file from the database to configure itself. In addition to reconfigurable hardware, a channel unit may have one or more other elements that require configuration (e.g., an up-converter, a down-converter, a power amplifier, etc.). The database may include information for configuring these elements as well.

In some implementations, some or all of the channel units 12, 14, 16, 18, 20 may include one or more digital processors. In these implementations, configuration of a channel unit may involve retrieving program code associated with an assignment from a memory and using the program code to program the channel unit.

Although channel units 12, 14, 16, 18, 20 are illustrated in as separate units, it should be understood that two or more of the units may be implemented within a common reconfigurable hardware device or digital processor in some implementations. It should also be appreciated that the number of active channel units 12, 14, 16, 18, 20 within system 10 may change over time in some implementations. For example, in some implementations, assignment manager 36 may create a new channel unit on occasion to work with a new transmit/receive assignment by appropriately configuring a reconfigurable processing resource. Assignment manager 36 may also terminate one or more of the channel units 12, 14, 16, 18, 20 on occasion to release corresponding processing resources. If assignment manager 36 changes an assignment currently allocated to a channel unit, or configures a channel unit for use with a new assignment, antenna controller 34 may update beam compatibility matrix information, which may form a part of the contention logic 22, and assignment-to-beam LUT 28 to reflect the changes.

As described above, each transmit/receive assignment (or each channel unit 12, 14, 16, 18, 20) may have alternating periods during which antenna resources are needed and not needed. In some implementations, channel units 12, 14, 16, 18, 20 may indicate to contention logic 22 when they are in need of antenna resources and when they no longer need them. Contention logic 22 may then use this information to determine which transmit/receive assignments will have access to antenna resources at any particular time. In at least one approach, each channel unit 12, 14, 16, 18, 20 that needs antenna access will send a request to contention logic 22. Contention logic 22 may then select one or more of the requesting channel units to receive antenna access. The selected channel unit(s)/assignment(s) will be referred to herein as the "successful contender(s)." After a channel unit has been selected for antenna access, the corresponding transmit/receive assignment may have access to the allocated antenna resources for as long as it needs them. When the transmit/receive assignment no longer needs antenna access, it may send a release signal to contention logic 22 releasing the corresponding antenna resource. Contention logic 22 may then select another contending channel unit to use the released antenna resource.

After contention logic 22 has selected successful contenders, it may transmit responses to the requesting channel units that indicate whether or not they were successful. In some implementations, the requesting channel units may use this response information to keep track of (or self-monitor) their contention success/failure ratio. In some implementations, this success/failure information may be used by assignment manager 36 to determine which transmit/receive assignments are to be replaced within channel units 12, 14, 16, 18, 20. For example, assignment manager 36 may determine that a lower priority alternative transmit/receive assignment may have better success than an assignment currently associated with a channel unit due to less-conflicting timing with higher priority assignments.

If a channel unit is a successful contender, the corresponding transmit/receive assignment may start to use the antenna resource almost immediately. That is, contention logic 22 may signal switch matrix 26 to provide an RF connection between the successful channel unit and a corresponding array segment. Contention logic 22 may also signal antenna configuration manager 32 to configure the array segment with the beam parameters for the transmit/receive assignment. After the RF connection has been made and the configuration is complete, the transmit/receive assignment can begin to perform its transmit or receive operation. As described above, in some implementations, antenna architectures may be used that are capable of switching between beams in a very rapid fashion. An example of one such antenna architecture is described in U.S. patent application Ser. No. 13/350,636 to Noble et al., which is commonly owned with the present application and is hereby incorporated by reference in its entirety.

As described previously, contention logic 22 may select successful contenders based, at least in part, on priority values associated with the corresponding transmit/receive assignments. The priority values may be selected based on any number of different criteria including, for example, the importance of the corresponding tasks, quality-of-service (QOS) designations, and/or others. Before choosing successful contenders, contention logic 22 may first check to determine whether any of the antenna resources (e.g., any of the antenna segments 42, 44, 46, 48) are currently available for use. If antenna resources are available, contention logic 22 may compare all of the requests that have been received to determine which request has a highest priority. In at least one implementation, a request sent by a channel unit may include, for example, an indication of the transmit/receive assignment associated with the request (e.g., an assignment number), an indication of the priority associated with the assignment, and an indication of whether the requested antenna resource will be used to transmit or receive signals. When two requests are received that have different priorities, contention logic 22 may select the contender that has the higher priority. When two requests are received that have the same priority, contention logic 22 may use any logic desired, for example, select the contender that was first in time to send a request. If two array segments are available, contention logic 22 may select the two contenders that have the highest priorities.

In some implementations, contention logic 22 may check beam compatibility before any final contention decisions are made. Beam compatibility matrix may not allow two beams to co-exist within antenna 40 if the beams are at the same frequency and one beam is a transmit beam and the other is a receive beam. For the BIT test, the compatibility matrix allows the simultaneous transmit and receive assignments to perform the test. Other compatibility conditions may also be implemented. If one array segment is available for use and contention logic 22 selects a transmit/receive assignment having a highest priority, contention logic 22 may check beam compatibility to determine whether that transmit/receive assignment (including whether it currently seeks to transmit or receive) is compatible with other transmit/receive assignments that are currently using array segments. If the highest priority assignment is incompatible, contention logic 22 may select the transmit/receive assignment having the next highest priority (or a transmit/receive assignment having the same priority, that sent its request later) to use the available antenna segment. This new transmit/receive assignment may then be checked against beam compatibility.

In some implementations, one or more of channel units 12, 14, 16, 18, 20 may request allocation of more than one array segment 42, 44, 46, 48, 52. For example, a transmit/receive assignment associated with channel unit 14 may need to generate a higher transmit power level than can be achieved using a single antenna segment and thus need allocation of two array segments. Contention logic 22 may handle this request in a similar manner to those described previously. For example, if two array segments are available, contention logic 22 may select the higher power assignment if it has the highest priority. If another transmit/receive assignment requesting a single array segment has a higher priority, contention logic 22 may select that assignment and another assignment requesting a single array segment to use the two available segments. If another transmit/receive assignment requesting a single array segment has the same priority as the one requesting two array segments, contention logic 22 may use any logic desired, for example, select the one that sent a request first. If the transmit/receive assignment requesting a single array segment sent the request first, contention logic 22 may also select an additional transmit/receive assignment requesting a single array segment to use the other available array segment. In at least one implementation, contention logic 22 may be implemented using hardware. Software, firmware, and hybrid implementations may alternatively be used.

Figure 2:
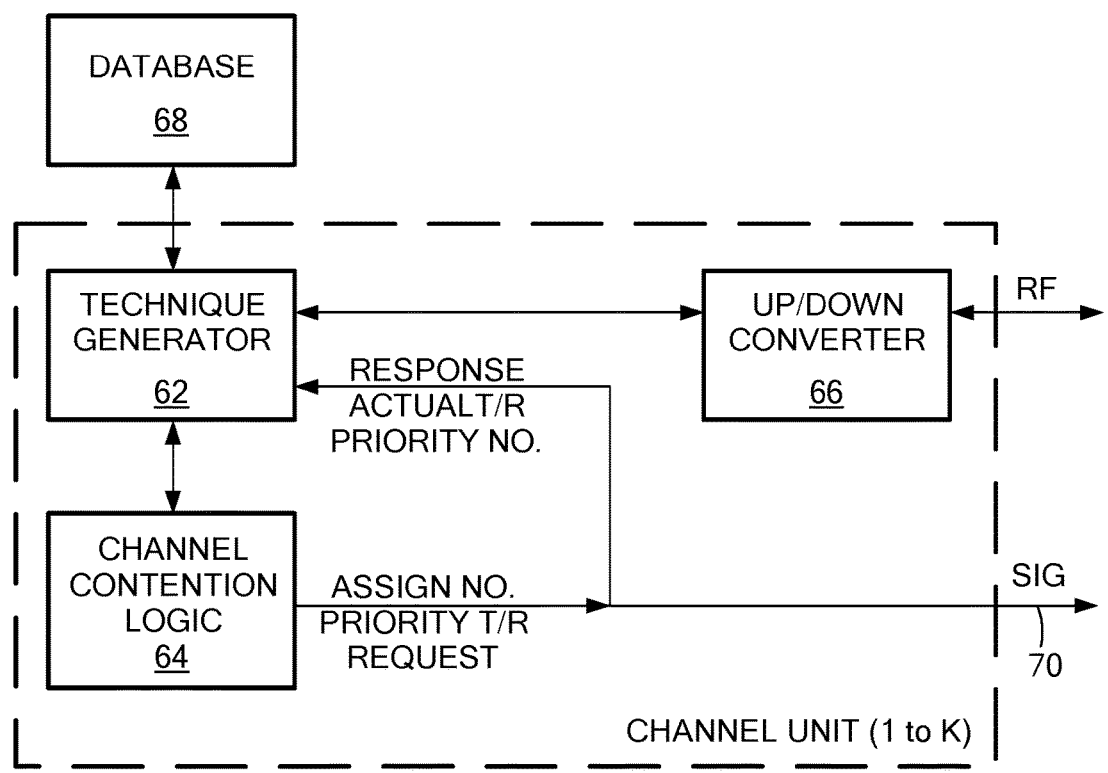
FIG. 2 is a block diagram of an example channel unit architecture for the AESA system of FIG. 1.

FIG. 2 is a block diagram illustrating functionality within an example channel unit 60 in accordance with an implementation. As illustrated, channel unit 60 may include a technique generator 62, channel contention logic 64, and an up/down converter 66. Technique generator 62 is operative for performing a technique associated with a corresponding transmit/receive assignment. Techniques may involve one or more signal generation, signal reception, signal routing, or other signal processing tasks. Techniques may range from simple to very complex in various implementations. For example, one technique may be as simple as generating a single tone or noise signal for transmission. Another technique may involve a complex sequence of transmitting and listening tasks that may be unpredictable at the time of assignment. This latter situation may arise, for example, when maintaining a voice communication link with a user having a push-to-talk (PTT) handset. When using a PTT handset, a channel is in use when someone pushes a button and speaks, but is not in use when the button is not being pressed. During the period of non-use, antenna resources may be released for use by other assignments. Antenna resources may then be requested every few milliseconds to listen for a signal from the remote handset. As will be appreciated, a wide variety of different techniques may be used in various applications.

Up/down converter 66 is operative for performing a frequency conversion operation required by a corresponding technique. For example, during a transmit operation, up/down converter 66 may operate as an up converter to up convert a modulation signal generated by technique generator 62. During a receive operation, up/down converter 66 may operate as a down converter to down convert RF signals received from a remote location. As will be appreciated, if a technique only involves transmit operations, only an up converter may be required. Likewise, if a technique only involves receive operations, only a down converter may be required. As will be further appreciated, depending upon the implementation, transmit operation may require a down converter and receive operations may require an up converter. Further, in some instances no up/down converter will be needed or it may be bypassed.

Channel contention logic 64 is operative for determining when antenna resources are required by channel unit 60 and for delivering a request to system contention logic (e.g., contention logic 22 of FIG. 1) to request resources in response thereto. In some implementations, a transmit/receive assignment may have specific triggering events or triggers that will determine when antenna resources are needed. Channel contention logic 64 may track these triggers for a corresponding transmit/receive assignment. As described above, in at least one implementation, a request may include an assignment number identifying an assignment, a priority value, and an indication of whether a receive operation or a transmit operation is to be performed. The request may be sent to the system contention logic via, for example, signaling line 70 or another medium. After the request has been sent, a response may be received from the system contention logic that indicates whether the request was granted. This response signal may be directed to technique generator 62. If the request was granted, technique generator 62 may be able to initiate a transmit or receive operation either immediately or after a short delay. Whether or not the request was granted, technique generator 62 may use the response signal to track a contention success/failure rate. When technique generator 62 is finished using the antenna resource, channel contention logic 64 may deliver a release signal to the system contention logic via, for example, signaling line 70 or another medium.

A channel unit 60 may be coupled to a database 68 storing data for use in configuring channel unit 60. Technique generator 62 may be implemented using, for example, reconfigurable hardware, software, or a hybrid of them in some implementations. Database 68 may include, for example, configuration files for use in configuring the reconfigurable hardware of technique generator 62 to perform a technique associated with the corresponding transmit/receive assignment. Database 68 may also include other data that may be used to configure channel unit 60. For example, database 68 may include a local oscillator (LO) frequency that is to be used by up/down converter 66 to perform a corresponding technique. As described previously, in some implementations, channel unit 60 may include self-configuration functionality that, given an allocated assignment, is capable of retrieving corresponding configuration data for use in configuring its internal circuitry. In other implementations, separate configuration functionality may be provided (e.g., assignment manager 36 of FIG. 1, etc.).

Referring to FIGS. 1 and 2, a stored beam parameter matrix 30 includes dedicated BIT beam state parameters to enable single array elements under test. The assignment lookup table 28 can contain assignment requests and configuration data needed by the assignment manager 36 to execute phases of BIT sequences, such as those shown in FIGS. 3A-3D. The assignment manager 36 executes each assignment request in the lookup table 28. The assignment manager configures a second channel unit 16, for example, to receive RF pulses from the first channel unit 12 (channel unit 1), for example.

A series of actions by the assignment manager 36 occur to effect the request. The assignment manager configures contention logic 22 for resource requests by the first channel unit 12 and a second channel unit 16. The assignment manager 36 configures the assignment to beam LUT 28 to use a selected BIT beam state for array element under test. The array configuration manager 32 configures a first array segment 44, for example, with the selected transmit beam parameters and a second array segment 46, for example, with receive beam parameters. The first channel unit 12 and the second channel unit 16 then request array resources and the contention logic 22 grants the requests and configures the switch matrix 26. The first array segment 44 and the second array segment 46 use assignment beam parameters to enable elements under test. The switch matrix 26 routes RF from the first channel unit 12 to the first array segment 44 and the first array segment 44 transmits RF pulses which are received by the second array segment 46. The switch matrix 26 routes received RF from the second array segment 46 to the second channel unit 16. BIT results are collected for complete sequences and processed.

Figure 3:
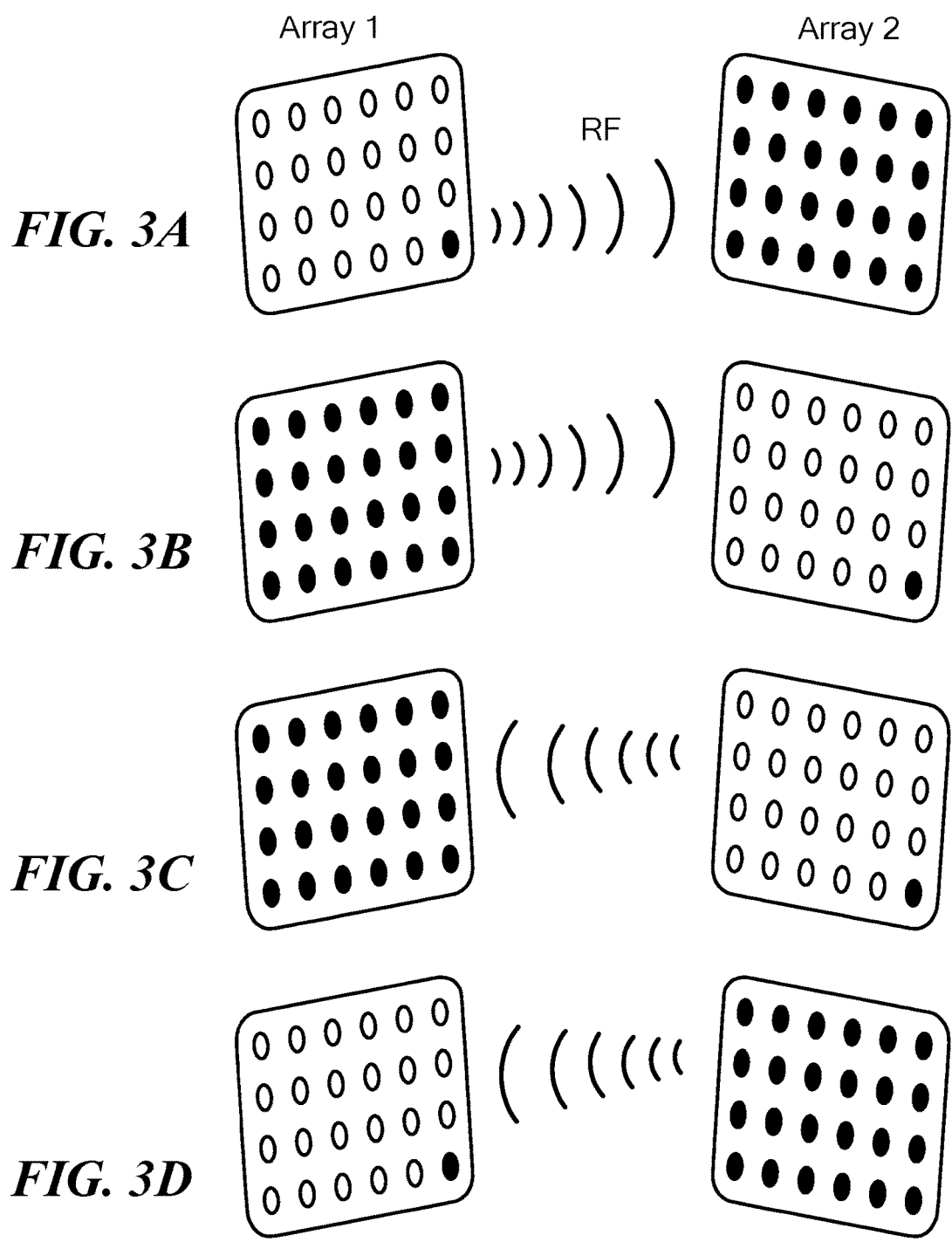
FIGS. 3A-3D show example BIT sequences for testing transmit and receive elements in first and second arrays.

FIGS. 3A-3D show an example BIT implementation for an assignment-based AESA having an antenna, such as the antenna 40 of FIG. 1. In the illustrated embodiment, in FIG. 3A and FIG. 3B show a first array 300 transmitting and a second array 302 receiving. FIG. 3C and FIG. 3D shows the first array 300 receiving and the second array 302 transmitting. As shown in FIG. 3A, RF pulses are transmitted by a single element 310 in the first array 300 and received by elements 312 in the second array 302. In the illustrated embodiment of FIG. 3A, all of the elements 312 of the second array 302 are active for receiving transmitted pulses. The received pulses can be processed to detect failures associated with one or more element. The first array 300 can iterate through BIT states for testing each element to detect failed elements in the first array. In embodiments, more than one element, such as a group of elements can transmit RF pulses.

It is understood that any practical subset of elements in the first array 300 and subset of elements in the second array 302 can be active to meet the needs of a particular application. For example, while one element may be used to transmit a pulse, at least eight elements can be active for receiving the transmitted pulses.

As shown in FIG. 3B, RF pulses can be transmitted by active elements 314 (all active in the illustrated embodiment) in the first array 300 and received by a single active element 316 in the second array 302. The second array 302 can iterate through BIT states to activate and test each element. While the number of elements receiving the pulses in FIG. 3A and the number of elements transmitting the pulses in FIG. 3B are shown as being equal in the illustrative embodiments, it is understood that different numbers of elements can be used to meet the needs of a particular application. In addition, different ones of the elements can be used for transmitting and receiving the pulses. For example, known good elements can be used to test elements having an unknown state.

As shown in FIG. 3C, RF pulses can be transmitted by a single element 318 in BIT states in the second array 302 to detect failed elements 320 in the first array 300. It is understood that this is similar to the BIT processing in FIG. 3A but in the opposite direction. FIG. 3D shows the second array 302 elements 322 (shown as all elements active) transmitting RF pulses to an element 324 in the first array 300 to detect failed elements in a manner similar to that shown in FIG. 3B. In embodiments, stored BIT beam states enable signal array elements. A test of a Tx/Rx element combination may be considered successful when the received samples contain a signal.

Figure 4:
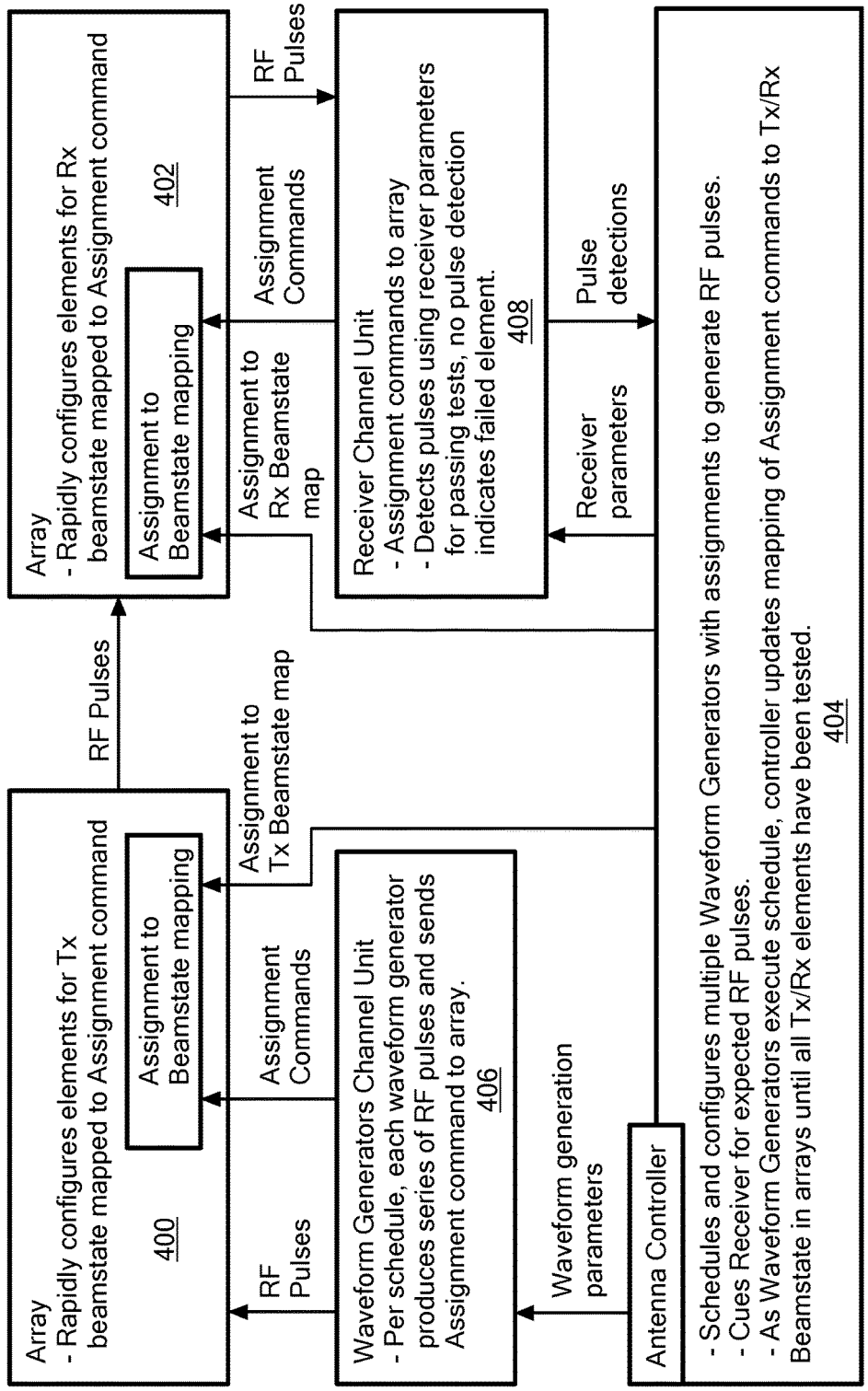
FIG. 4 is a diagram showing processing and interaction for BIT pulse transmitting and receiving in accordance with example embodiments of the invention.

FIG. 4 shows illustrative self-test processing for first and second arrays 400, 402. An antenna controller 404 is coupled to the first and second arrays 400, 402 for scheduling waveform generators with assignments to generate RF pulses, such as pulses shown in FIGS. 3A-3D. The antenna controller 404 can control a waveform generator(s) 406 for the first array 402 and a receiver 408 in the second array 402. It is understood that the first array 400 can include a receiver and the second array 402 can include a waveform generator(s). In embodiments, the antenna controller 404 controls Tx pulse transmission for the first array 400 and informs the receiver 408 of the second array 402 for expected RF pulses.

The antenna controller 404 schedules and configures waveform generators 406 for the first array 400 with assignments including waveform generation parameters to generate RF pulses and provides receive parameters to the receiver 408 for the second array 402. The antenna controller 404 provides assignment to transmit beamstate mapping information to the first array 400. The antenna controller 404 can control transmitting and receiving pulses until the scheduled Tx/Rx elements have been exercised.

Based on the parameters from the antenna controller 404, the waveform generator(s) 406 produce RF pulses for the first array 400 and sends assignment commands. The first array 400 uses this information, along with assignment to transmit to beamstate information, to configure transmit elements a beamstate mapped to the current assignment command from the waveform generator 406. The first array 400 transmits the pulses for the given assignment.

The second array 402, based on assignment to receive beamstate mapping from the antenna controller 404 and assignment commands from the receiver 408, configures elements for receiving the transmitted pulses from the first array 400. The RF pulses are detected and received by the receiver 408 and provided to the antenna controller 404 for processing.

In another aspect, elements in a multiple assignment-based arrays can be tested in parallel with use of test signal clutter rejection in accordance with example embodiments of the invention. Waveform sequencing properties are used to generate desired pulse patterns that enable clutter rejection.

Figure 5:
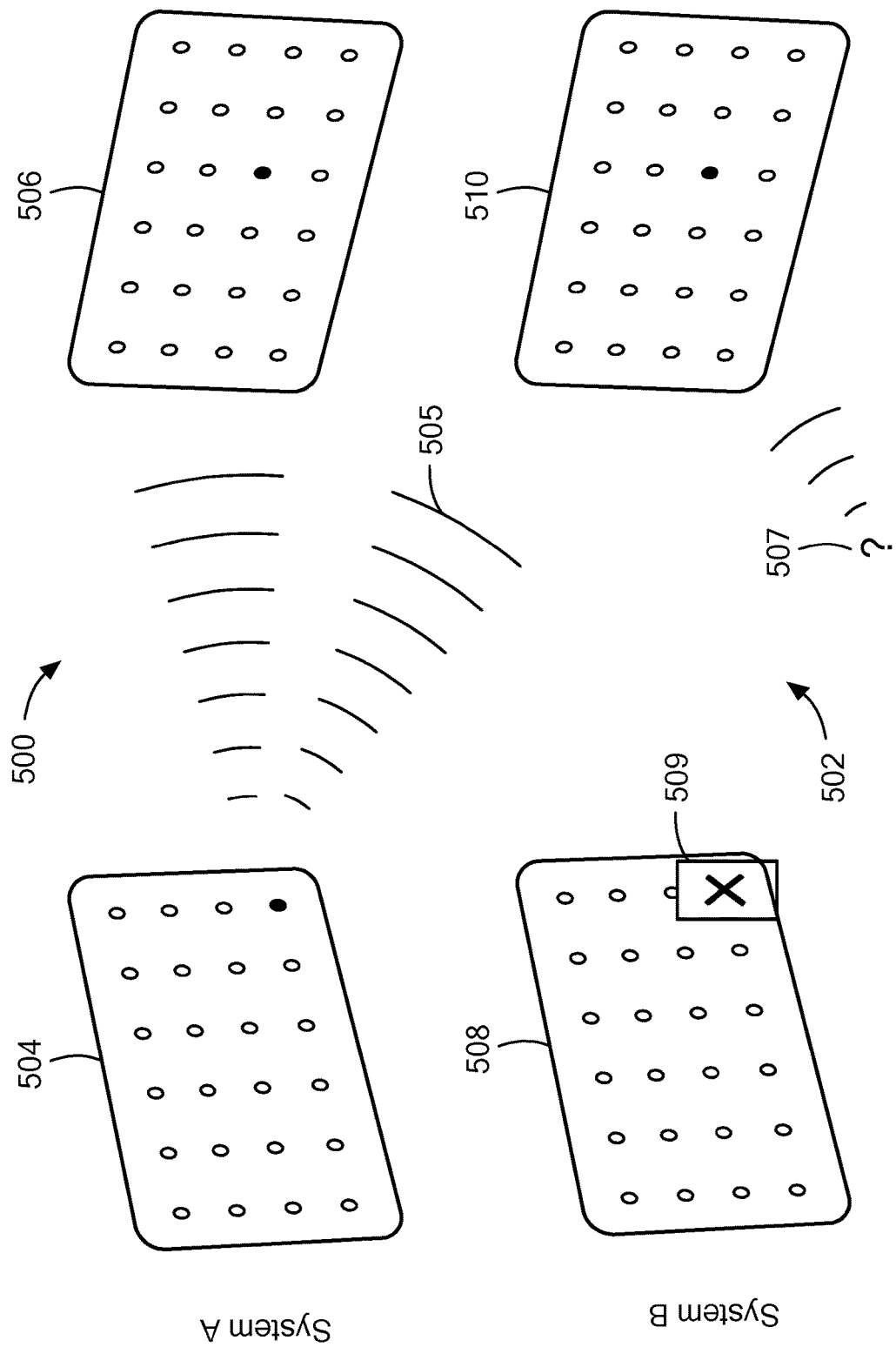
FIG. 5 is a schematic representation of testing elements in first and second arrays.

FIG. 5 shows first and second systems 500, 502 in proximity with each such that signals transmitted by the first system may be received by the other, and vice-versa. The first system 500 has first and second arrays 504, 506 and the second system 502 has first and second arrays 508, 510. In one test scenario, the first array 504 of the first system 500 can generate test signals to be received by the second array 506 of the first system. The second array 510 of the second system 502, for example, may receive the signal from the first array 504 of the first system 500 that may erroneously generate element passage or failure in the second array 510 of the second system 502. In addition, a pulse 505 from the first array 504 of the first system 500 or a pulse 507 some other source, for example, may result in incorrect test passage when a failed element 509 is present in the first array 508 of the second array 502.

Figure 6:
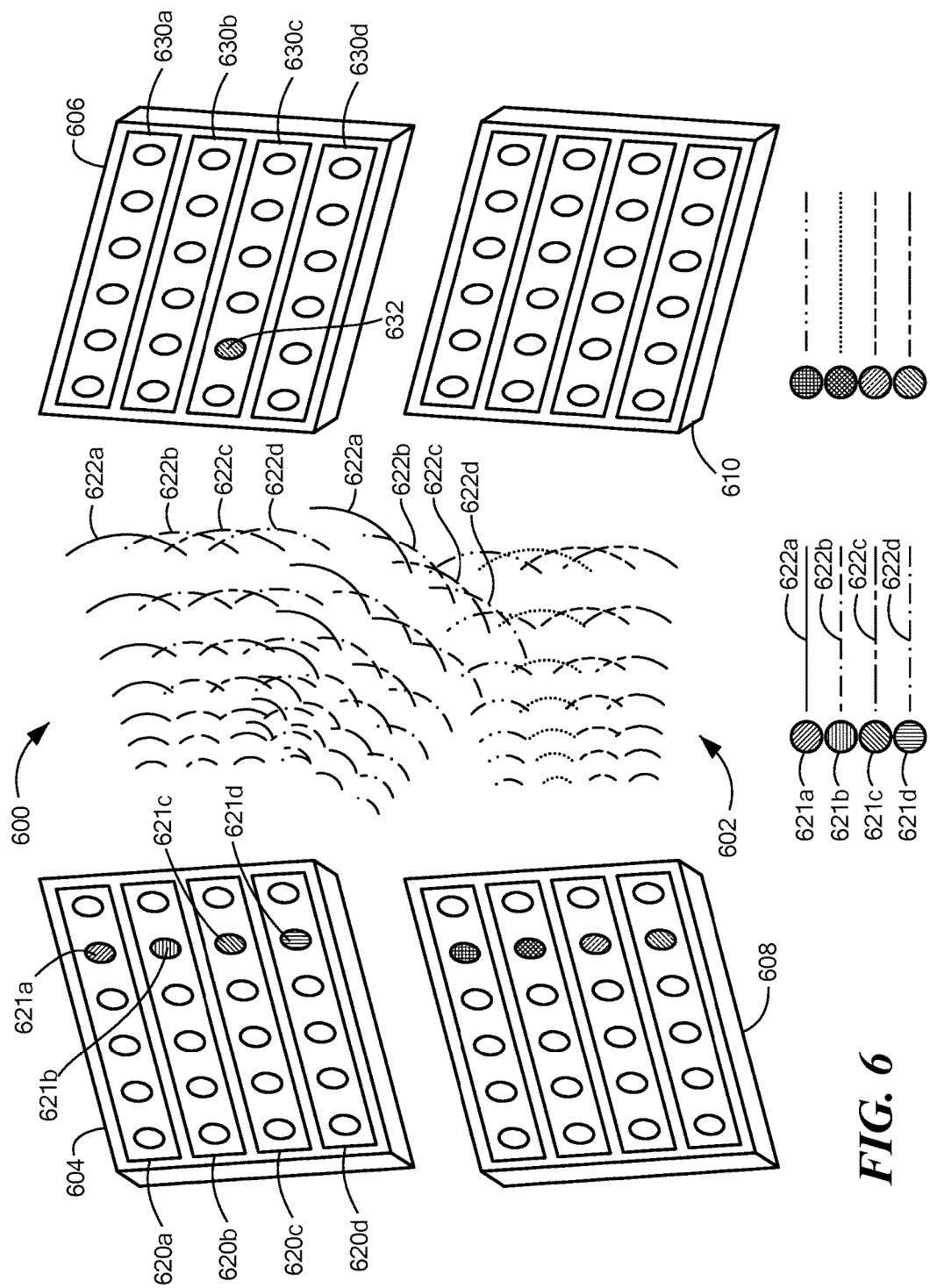
FIG. 6 is a schematic representation of testing elements in first and second arrays with a clutter-rejecting approach.

FIG. 6 shows first and second systems 600, 602 in proximity with each such that signals transmitted by the first system may be received by the other, and vice-versa. The first and second systems can be considered collocated if a transmitter of the first system 600 can generate test signals that are received by the second system 602 and/or vice-versa. The first system 600 has first and second arrays 604, 606 and the second system 602 has first and second arrays 608, 610

In example embodiment, the first array 604 of the first system 600 excites a subset of elements with different signals for transmission to the second array 606 of the first system 600. In the illustrated embodiment, the first array 604 includes first, second, third, and fourth subarrays $620a,b,c,d$ each of which excites one element $621a,b,c,d$ to generate first, second, third, and fourth signals $622a,b,c,d$, each of which has different characteristics.

The second array 606 of the first system 600 includes first, second, third, and fourth subarrays $630a,b,c,d$. In the illustrated embodiment, a particular element 632 of the third array $630c$ is active to receive the signals $622a\text{-}d$ generated by the first array 604. It should be noted that these signals $622a\text{-}d$ may also be received by the second array 610 of the second system 602. As described more fully below, clutter rejection of these signals by the second array 610 of the second system 602 is performed.

While iterating over the elements, the waveform properties can be changed for each element so that the chance of two collocated systems producing the same waveform at the same time is minimal. For additional prevention of interference, the waveform properties could be customized by a system identification such as a serial number so that individual instances of the system never share the same waveform properties.

It is understood that any practical number of elements in the various transmitting subarrays can be active and that any practical number of elements in receiving subarrays can be active at a given time to meet the needs of a particular application.

In embodiments, each of the transmitted signals from each of the elements is different in at least one characteristic so that each element receiving a signal can differentiate each signal from any other signal transmitted by the first arrays 604, 606.

In embodiments, transmitted signals can vary in characteristics, such as center frequency, pulse repetition interval (PM), modulation, and the like. Intrapulse modulation can be unique for each signal. For example, the slope of a linear frequency modulation could be different for each signal. The transmitted signal modulation should be detectable and differentiated from other signals by the specific receiver channel unit employed in the system. In general, the waveform parameters should be distinguishable by the system's receive capability.

In embodiments, waveform generators, such as waveform generator 406 of FIG. 4, can produce unique waveform patterns for each transmit beamstate. A receiver is cued to detect the unique waveform patterns, rejecting interference from other systems and extraneous RF clutter. Stored subarray beamstate parameters enable parallel testing of transmitting elements in each subarray. A test of a transmit-receive element combination is successful when the received samples contain expected RF waveform.

Figure 7:
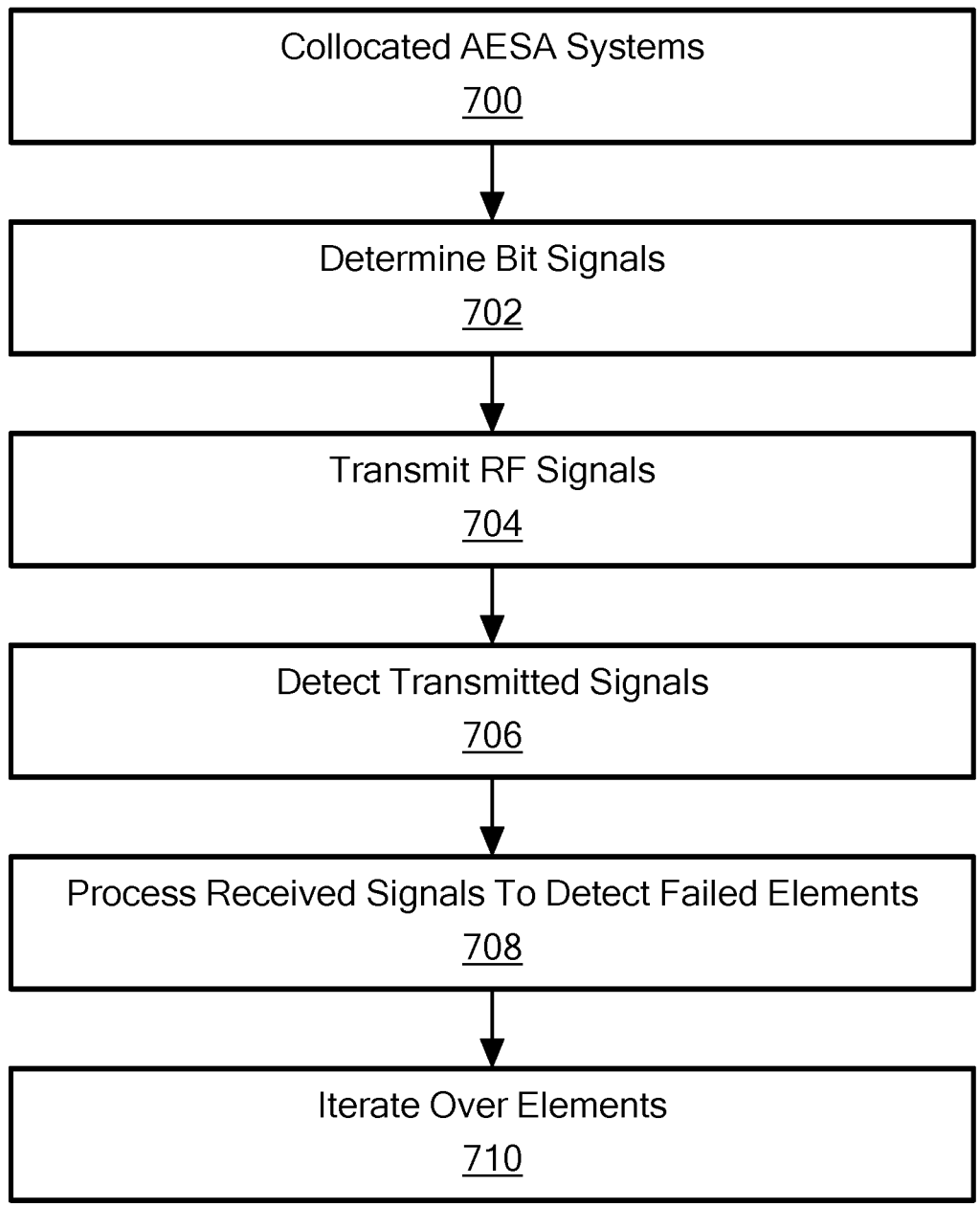
FIG. 7 is a flow diagram showing an example sequence of steps for testing elements in first and second arrays with a clutter-rejecting approach.

FIG. 7 shows an illustrative sequence of steps for clutter-rejecting BIT of AESA arrays in accordance with example embodiments of the invention. In step 700, multiple systems having first and second arrays are located in proximity to each other, such as shown in FIG. 6. In step 702, the signals to be transmitted are determined. For example, signal parameters for the various transmitting elements vary by PM, center frequency, modulation, etc. In step 704, the first arrays emit multiple signals simultaneously with different signal parameters to generate unique patterns. The transmitting arrays of the system can transmit signals in parallel by subarray or by element.

In step 706, one or more pulse detector elements on the second (receiving) array/subarray are activated for detecting the transmitted signals. In step 708, BIT processing is performed to determine which receiving elements observe a matching signal, which can be considered to pass, and which do not, which can be considered to fail. Failures can include failure to detect the test signal, time-out expirations, and the like. In step 710, elements in the transmit and receive elements become active in various BIT sequences to iterate over groups of signals to detect failed elements. For example, the system can iterate over groups of signals according to the maximum number of transmitting elements with the option to reuse signal parameters between groups or repeat parameters for each group.

In embodiments, the incidence of tests falsely passing due to spurious signal detections can be reduced. In addition, the time to test an array end-to-end using parallel signal transmission can be reduced compared to conventional techniques. Further, embodiments of the invention can improve co-site performance of multiple similar systems.

Figure 8:
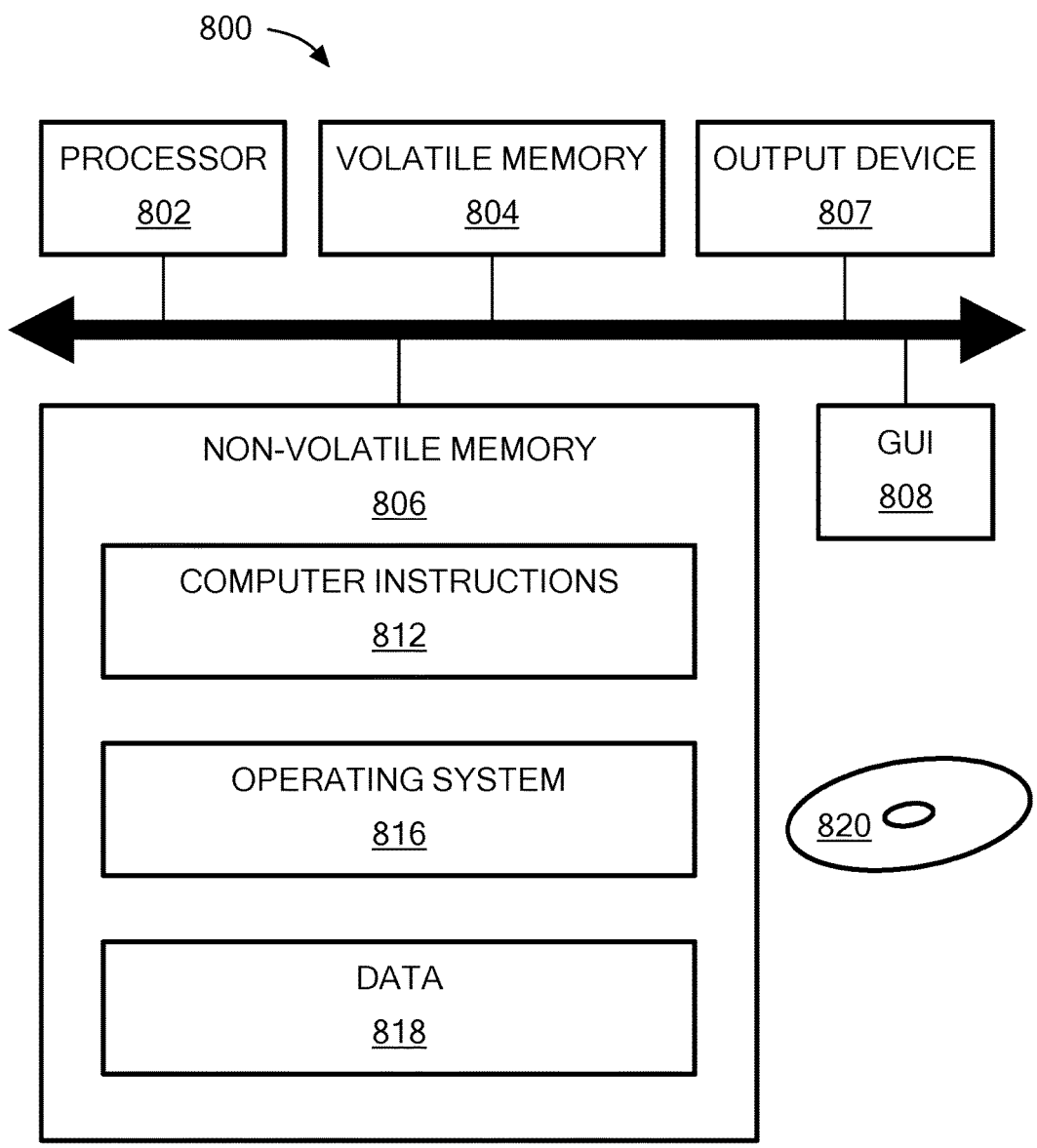
FIG. 8 is a schematic representation of an example computer that can perform at least a portion of the processing described herein.

FIG. 8 shows an exemplary computer 800 that can perform at least part of the processing described herein, such as processing performed by the antenna module 34 of FIG. 1, antenna controller 404, waveform generator 406, receiver 408, and/or array 400, 402 of FIG. 4, and active element control, as described for example, in FIGS. 3A-3D and FIG. 6. The computer 800 includes a processor 802, a volatile memory 804, a non-volatile memory 806 (e.g., hard disk), an output device 807 and a graphical user interface (GUI) 808 (e.g., a mouse, a keyboard, a display, for example). The non-volatile memory 806 stores computer instructions 812, an operating system 816 and data 818. In one example, the computer instructions 812 are executed by the processor 802 out of volatile memory 804. In one embodiment, an article 820 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A method, comprising:
performing built-in-test (BIT) of array elements in first and second arrays in an assignment-based active electronically scanned array (AESA) by:
receiving assignments for at least one BIT sequence from pre-determined BIT assignments each of which is mapped to a beamstate, wherein the assignments correspond to generating multiple simultaneous transmit signals having differing characteristics to provide clutter rejection by the second array;
configuring one or more elements of the first array for transmitting pulses corresponding to the at least one BIT sequence;
configuring one or more elements of the second array for receiving the pulses corresponding to the at least one BIT sequence;
transmitting the pulses by the first array corresponding to the at least one BIT sequence;
receiving the transmitted pulses at the second array for the at least one BIT sequence;

processing the received pulses for the at least one BIT sequence to detect failures associated with one or more of the elements in the first array and/or the elements in the second array; and
for third and fourth arrays collocated with the first and second arrays, providing clutter rejection for the fourth array when receiving the transmitted pulses from the first array.

2. The method according to claim 1, wherein transmitting pulses by the first array corresponding to the at least one BIT sequence includes transmitting pulses each having different characteristics to provide the clutter rejection.

3. The method according to claim 2, wherein the different characteristics include different center frequencies.

4. The method according to claim 2, wherein the different characteristics include different pulse repetition intervals.

5. The method according to claim 2, wherein the different characteristics include different modulation types.

6. The method according to claim 2, further including, for the third and fourth arrays collocated with the first and second arrays, providing clutter rejection by transmitting the pulses by the first array and the third array with different characteristics.

7. The method according to claim 1, further including iterating pulse transmissions over the one or more elements of the first and second arrays to detect failed elements in the one or more elements of the first and second arrays.

8. The method according to claim 1, further including iterating pulse transmissions over one or more elements of the third and fourth arrays to detect failed elements in the one or more elements of the third and fourth arrays such that receiving ones of the one or more elements differentiate each of the pulses transmitted by the first, second, third, and fourth arrays.

9. A system, comprising:
an antenna controller configured to perform built-in-test (BIT) of array elements in first and second arrays in an assignment-based active electronically scanned array (AESA), the antenna controller configured to:
perform built-in-test (BIT) of array elements in first and second arrays in an assignment-based active electronically scanned array (AESA) by:
receiving assignments for at least one BIT sequence from pre-determined BIT assignments each of which is mapped to a beamstate, wherein the assignments correspond to generating multiple simultaneous transmit signals having differing characteristics to provide clutter rejection by the second array;
configuring one or more elements of the first array for transmitting pulses corresponding to the at least one BIT sequence;
configuring one or more elements of the second array for receiving the pulses corresponding to the at least one BIT sequence;
transmitting the pulses by the first array corresponding to the at least one BIT sequence;
receiving the transmitted pulses at the second array for the at least one BIT sequence;
processing the received pulses for the at least one BIT sequence to detect failures associated with one or more of the elements in the first array and/or the elements in the second array; and
for third and fourth arrays collocated with the first and second arrays, providing clutter rejection for the fourth array when receiving the transmitted pulses from the first array.

10. The system according to claim 9, wherein transmitting pulses by the first array corresponding to the at least one BIT sequence includes transmitting pulses each having different characteristics to provide the clutter rejection.

11. The system according to claim 10, wherein the different characteristics include different center frequencies.

12. The system according to claim 10, wherein the different characteristics include different pulse repetition intervals.

13. The system according to claim 10, wherein the different characteristics include different modulation types.

14. The system according to claim 10, wherein the antenna controller is further configured to: for the third and fourth arrays collocated with the first and second arrays, provide clutter rejection by transmitting the pulses by the first array and the third array with different characteristics.

15. The system according to claim 10, wherein the antenna controller is further configured to: iterate pulse transmissions over the one or more elements of the first and second arrays to detect failed elements in the one or more elements of the first and second arrays.

16. The system according to claim 9, wherein the antenna controller is further configured to iterate pulse transmissions over one or more elements of the third and fourth arrays to detect failed elements in the one or more elements of the third and fourth arrays such that receiving ones of the one or more elements can differentiate each of the pulses transmitted by the first, second, third, and fourth arrays.

17. A system, comprising:
first and second arrays that are collocated, each of the first and second arrays comprising a respective waveform generator and a receive module;
an antenna controller coupled to the first and second arrays, the respective waveform generators and the receiver modules, the antenna controller configured to perform built-in-test (BIT) of array elements in the first and second arrays in an assignment-based active electronically scanned array (AESA), the antenna controller configured to:
generate and send waveform generator parameters to the respective waveform generators which generates radio frequency (RF) pulse information and assignments commands for transmission,
generate assignments for at least one BIT sequence from pre-determined BIT assignments each of which is mapped to a beamstate, wherein the assignments are sent to a first array which will be transmitting RF signals;
configure one or more elements of the first array for transmitting pulses corresponding to the at least one BIT sequence such that each of the pulses has different characteristics to provide clutter rejection;
configure one or more elements of the second array for receiving the pulses corresponding to the at least one BIT sequence;
generate information to control transmission of the pulses by the first array corresponding to the at least one BIT sequence;
generate information to control receiving of the transmitted pulses at the second array for the at least one BIT sequence;
process the received pulses for the at least one BIT sequence to detect failures associated with one or more of the elements in the first array and/or the elements in the second array; and for third and fourth arrays collocated with the first and second arrays, provide clutter rejection for the forth array when receive the transmitted pulses from the first array.

* * * * *